(12) United States Patent
Ivanova et al.

(10) Patent No.: US 11,227,763 B2
(45) Date of Patent: Jan. 18, 2022

(54) METHODS FOR DEPOSITING A HAFNIUM LANTHANUM OXIDE FILM ON A SUBSTRATE BY A CYCLICAL DEPOSITION PROCESS IN A REACTION CHAMBER

(71) Applicant: ASM IP Holding B.V., Almere (NL)

(72) Inventors: Tatiana Ivanova, Espoo (FI); Perttu Sippola, Helsinki (FI); Michael Eugene Givens, Helsinki (FI)

(73) Assignee: ASM IP Holding B.V., Almere (NL)

( * ) Notice: Subject to any disclaimer, the term of this patent is extended or adjusted under 35 U.S.C. 154(b) by 28 days.

(21) Appl. No.: 16/790,780

(22) Filed: Feb. 14, 2020

(65) Prior Publication Data
US 2020/0266055 A1    Aug. 20, 2020

Related U.S. Application Data

(60) Provisional application No. 62/805,345, filed on Feb. 14, 2019.

(51) Int. Cl.
*H01L 21/02* (2006.01)
*H01L 29/51* (2006.01)
*H01L 21/28* (2006.01)

(52) U.S. Cl.
CPC .... *H01L 21/02194* (2013.01); *H01L 21/0228* (2013.01); *H01L 21/02181* (2013.01); *H01L 21/02192* (2013.01); *H01L 21/02205* (2013.01); *H01L 21/02356* (2013.01); *H01L 21/28185* (2013.01); *H01L 21/28194* (2013.01); *H01L 29/517* (2013.01)

(58) Field of Classification Search
CPC ......... H01L 21/02194; H01L 21/02181; H01L 21/02192; H01L 21/02205; H01L 21/02356; H01L 21/28185; H01L 21/28194; H01L 21/0228; H01L 29/517
See application file for complete search history.

(56) References Cited

U.S. PATENT DOCUMENTS

| 9,543,188 B2 * | 1/2017 | Luo ............... H01L 21/76232 |
| 2010/0270626 A1 * | 10/2010 | Raisanen ......... H01L 21/28194 257/410 |
| 2014/0027702 A1 * | 1/2014 | Lu ..................... H01L 27/2436 257/4 |
| 2015/0104575 A1 * | 4/2015 | Takoudis .......... C23C 16/45553 427/255.35 |
| 2017/0110313 A1 | 4/2017 | Tang et al. |

* cited by examiner

*Primary Examiner* — Quoc D Hoang
(74) *Attorney, Agent, or Firm* — Laine IP Oy

(57) ABSTRACT

A method for depositing a hafnium lanthanum oxide film on a substrate by a cyclical deposition in a reaction chamber is disclosed. The method may include: depositing a hafnium oxide film on the substrate utilizing a first sub-cycle of the cyclical deposition process and depositing a lanthanum oxide film utilizing a second sub-cycle of the cyclical deposition process.

20 Claims, 5 Drawing Sheets

METHODS FOR DEPOSITING A HAFNIUM LANTHANUM OXIDE FILM ON A SUBSTRATE BY A CYCLICAL DEPOSITION PROCESS IN A REACTION CHAMBER

FIELD OF INVENTION

The present disclosure relates generally to methods for depositing a hafnium lanthanum oxide film by a cyclical deposition process and to particular methods for depositing a hafnium lanthanum oxide film by a cyclical deposition process including a first sub-cycle and a second sub-cycle.

BACKGROUND OF THE DISCLOSURE

For many years, silicon dioxide ($SiO_2$) has been used in semiconductor substrates for components such as transistor gate dielectrics and capacitor dielectrics. However, as circuit components have reduced in size, the electrical performance characteristics of $SiO_2$ result in undesirable effects such as increased leakage current. Controlling leakage current to maintain high speed and low power performance presents a challenge when older-generation dielectrics such as $SiO_2$ are used in the fabrication of next generation integrated circuit geometries.

Newer processes, especially those that use fabrication geometries less than 65 nm have begun to include high dielectric constant ("high-k") insulators in semiconductor fabrication. Some chipmakers now rely on high-k dielectrics, especially for 45 nm and smaller process geometries. Replacing $SiO_2$ gate dielectrics with high-k dielectrics is important to achieve smaller device geometries while controlling leakage and other electrical performance criteria.

While the use of high-k dielectrics allows for smaller scaling of integrated circuit components, such as transistor gate dielectrics, new performance issues arise from their use. For example, when conventional gate electrodes are paired with a high-k dielectric, such as $HfO_2$, problems such as low yield and poor threshold voltage ($V_{th}$) control must be addressed.

Research has been conducted regarding the benefits of using ternary oxides in high-k dielectric applications. Specifically, films manufactured from hafnium lanthanum oxides ($HfLaO_x$) show promise in providing high dielectric constant values, reduced crystallization temperatures, improved yield, and better threshold voltage ($V_{th}$) control as compared to other high-k dielectrics, such as $HfO_2$. Furthermore, unlike other Hf-based amorphous materials, such as $HfSiO_x$ or $HfAlO_x$, the permittivity of $HfLaO_x$ retains a high value (>20). Thus $HfLaO_x$ dielectrics are desirable in terms of electrical performance criteria, but time- and cost-effective fabrication of $HfLaO_x$ dielectrics on substrates creates challenges.

Accordingly, methods for depositing a high-k hafnium lanthanum oxide film on a substrate would be highly desired.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, methods for depositing a hafnium lanthanum oxide film on a substrate by a cyclical deposition process in a reaction chamber are provided. The methods may comprise: depositing a hafnium oxide film on a substrate utilizing at least one deposition cycle of a first sub-cycle of the cyclical deposition process, wherein one deposition cycle of the first sub-cycle comprises: contacting the substrate with a hafnium vapor phase precursor; and contacting the substrate with a first oxidizer precursor comprising water ($H_2O$). The methods may also comprise: depositing a lanthanum oxide film on the substrate utilizing at least one deposition cycle of a second sub-cycle of the cyclical deposition process, wherein one deposition cycle of the second sub-cycle comprises: contacting the substrate with a lanthanum vapor phase precursor; and contacting the substrate with a second oxidizer precursor comprising molecular oxygen ($O_2$).

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

Figure 5:
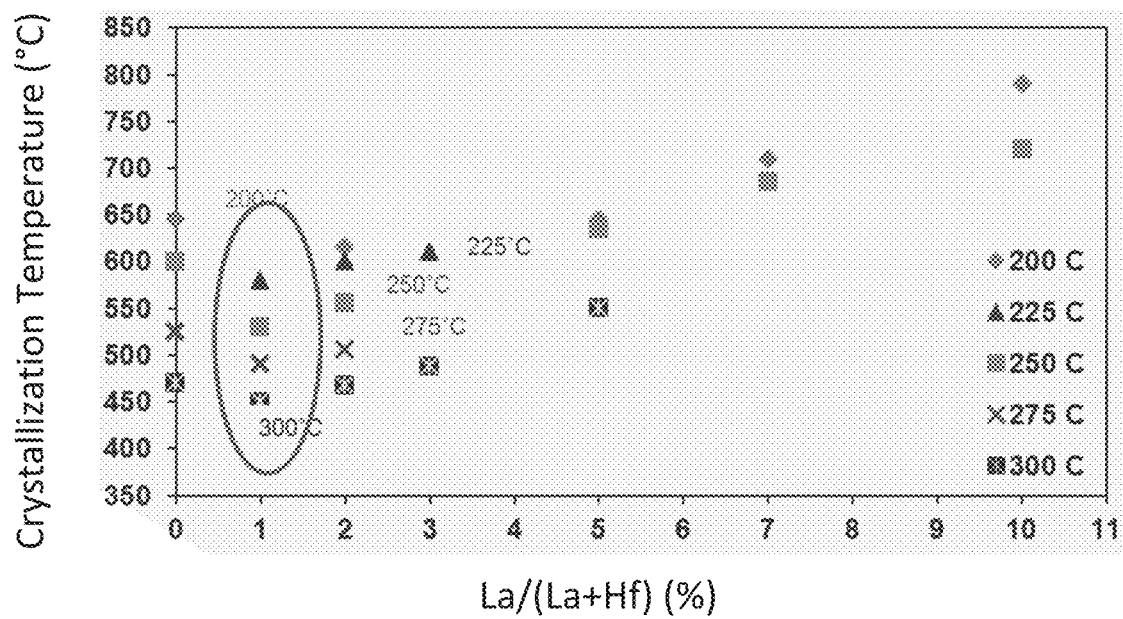
Figure 6:
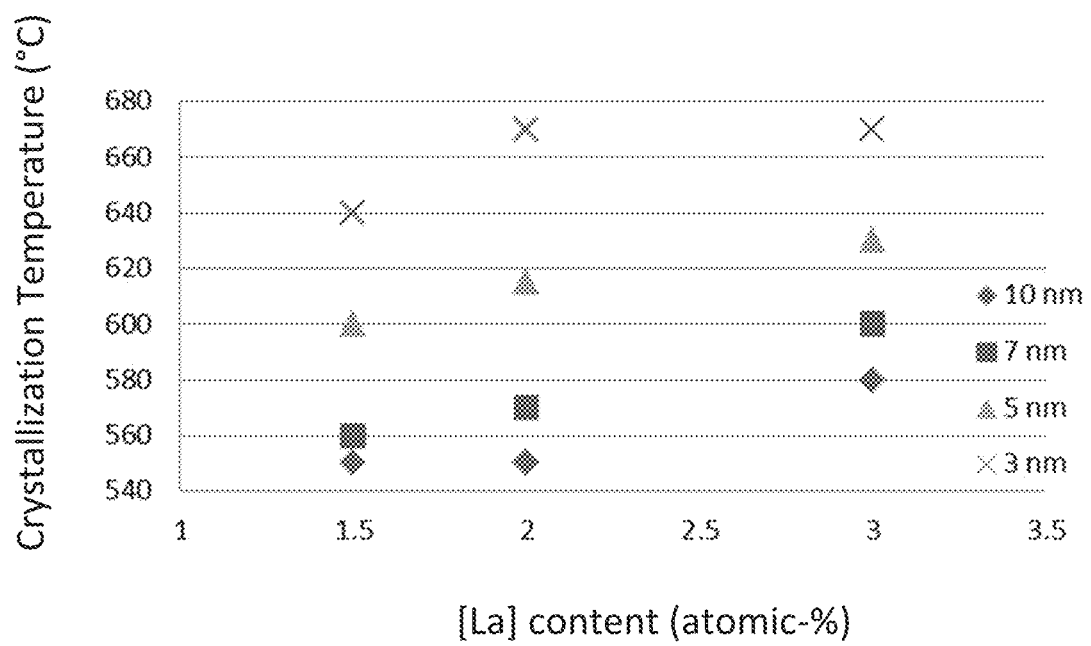

FIG. 5 illustrates data showing the crystallization temperature for a number of exemplary hafnium lanthanum oxide films with increasing lanthanum composition according to embodiments of the disclosure; and FIG. 6 illustrates data showing the crystallization temperature for a number of exemplary hafnium lanthanum oxide films with increasing lanthanum composition (atomic-%) at various film thicknesses according to embodiments of the disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The illustrations presented herein are not meant to be actual views of any particular material, structure, or device, but are merely idealized representations that are used to describe embodiments of the disclosure.

As used herein, the term "cyclic deposition" may refer to the sequential introduction of precursors (reactants) into a reaction chamber to deposit a film over a substrate and includes deposition techniques, such as atomic layer deposition and cyclical chemical vapor deposition.

As used herein, the term "cyclical chemical vapor deposition" may refer to any process wherein a substrate is sequentially exposed to two or more volatile precursors, which react and/or decompose on a substrate to produce a desired deposition.

As used herein, the term "substrate" may refer to any underlying material or materials that may be used, or upon which, a device, a circuit, or a film may be formed.

As used herein, the term "atomic layer deposition" (ALD) may refer to a vapor deposition process in which deposition cycles, preferably a plurality of consecutive deposition cycles, are conducted in a reaction chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition," "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "film" may refer to any continuous or non-continuous structures, material, or materials, deposited by the methods disclosed herein. For example, a "film" could include 2D materials, nanorods, nanotubes, nanolaminates, or nanoparticles or even partial or full molecular layers or partial or full atomic layers or clusters of atoms and/or molecules. A "film" may also comprise material(s) or layer(s) with pinholes, but still be at least partially continuous.

As used herein, the term "hafnium lanthanum oxide film" may refer to a film including a hafnium component, a lanthanum component, and an oxygen component.

As used herein, the term "sub-cycle" may refer to a cyclical deposition process comprising one or more unit cycles repeated for a predetermined number of times. A combination of two or more sub-cycles may make up an overall cyclical deposition process. This combination of two or more sub-cycles may be referred to as a cyclical deposition super-cycle.

As used herein, the term "metalorganic" or "organometallic" are used interchangeably and may refer to organic compounds containing a metal species. Organometallic compounds may be considered to be subclass of metalorganic compounds having direct metal-carbon bonds.

As used herein, the terms "contacting" or "exposing" are used interchangeably, and may refer to the interaction between a surface of a substrate (and any deposited film) and one or more precursors or reactants.

A number of example materials are given throughout the embodiments of the current disclosure, it should be noted that the chemical formulas given for each of the example materials should not be construed as limiting and that the non-limiting example materials given should not be limited by a given example stoichiometry.

A wide variety of methods and related apparatus exist to deposit a high dielectric constant film on a substrate such as a semiconductor. Some methods form a thin film on a substrate by utilizing a surface reaction on the semiconductor, such as vacuum evaporation deposition, molecular beam epitaxy, different variants of Chemical Vapor Deposition (CVD) (including low-pressure CVD, organometallic CVD and plasma-enhanced CVD) and Atomic Layer Deposition (ALD).

ALD is a method of depositing films on a surface of a substrate through the sequential introduction of various precursor species. A conventional ALD apparatus may include a reactor chamber, a substrate holder, a gas flow system including gas inlets for providing precursors and reactants to a substrate surface and an exhaust system for removing used gases. The growth mechanism relies on the adsorption of a precursor on the active sites of the substrate and conditions are preferably maintained such that no more than a monolayer forms on the substrate, thereby self-terminating the process. Exposing the substrate to a first precursor is usually followed by a purging stage or other removal process (e.g., an evacuation or "pump down") wherein any excess amounts of the first precursor as well as any reaction by-products are removed from the reaction chamber. The second reactant or precursor is then introduced into the reaction chamber at which time it reacts with the first precursor, and this reaction creates the desired film on the substrate. The reaction terminates when all of the available first precursor species adsorbed on the substrate has been reacted with the second precursor. A second purge or other removal stage is then performed which rids the reaction chamber of any remaining second precursor and possible reaction by-products. This cycle can be repeated to grow a film to a desired thickness.

One of the recognized advantages of ALD over other deposition processes is that it is self-saturating and uniform, as long as the temperature is within the ALD window (which is above the condensation temperature and below the thermal decomposition temperature of the precursors) and sufficient reactant dose is provided to saturate the surface in each pulse. Thus, neither temperature nor gas supply may need to be perfectly uniform in order to obtain uniform deposition.

Different dielectric films have been deposited employing ALD processes. Known dielectric films deposited utilizing ALD processes may include binary oxides such as, for example, $Al_2O_3$, $HfO_2$, $ZrO_2$, $La_2O_3$, and $Ta_2O_5$. Ternary oxides are also materials that may be deposited by ALD and may include, for example, HfZrO, HfAlO and HfLaO. Selection of the appropriate material for use in high-k dielectric applications requires consideration of the impact of the deposited substance on the particular substrate and circuit environment.

In the case of ALD of a hafnium lanthanum oxide, a hafnium vapor phase precursor may comprise hafnium tetrachloride ($HfCl_4$), for example, and a lanthanum vapor phase precursor may comprise $La(THD)_3$. Due to the hygroscopic nature of $La_2O_3$, ozone ($O_3$) is often used instead of $H_2O$ as an oxidizer in prior art processes, but unfortunately, both the $HfCl_4/O_3$ process and the $La(THD)_3/O_3$ process are highly sensitive to even small changes in the amount of ozone present. Accordingly, achieving a repeatable process is difficult with prior ALD processes.

The present disclosure therefore includes methods that may be employed for the deposition of a hafnium lanthanum oxide film by a cyclical deposition process. The cyclical deposition process may comprise a cyclical deposition super-cycle comprising at least a first sub-cycle, utilized for the deposition of a hafnium oxide film, and a second sub-cycle, utilized for the deposition of a lanthanum oxide film. The hafnium lanthanum oxide film may be deposited by repeating the cyclical deposition super-cycle one or more times such that alternating films of hafnium oxide and lanthanum oxide are deposited on the substrate. In some applications, the alternating hafnium oxide and lanthanum oxide films may be deposited to a thickness such that the resultant film comprises either a substantially compositionally uniform hafnium lanthanum oxide film, or alternatively a nanolaminate structure comprising a hafnium lanthanum oxide film including identifiable alternating layers of hafnium oxide and lanthanum oxide.

The present disclosure overcomes the prior art limitations in ALD of hafnium lanthanum oxide films by utilizing mixed oxidizer precursors, i.e., a first oxidizer precursor may be utilized during the first sub-cycle for depositing a hafnium oxide film and a second oxidizer precursor (different to the first oxidizer precursor) may be utilized during the second sub-cycle for depositing a lanthanum oxide film.

The cyclical deposition processes disclosed herein may therefore deposit a hafnium lanthanum oxide film with superior characteristics to those deposited by previous deposition processes. In addition, the cyclical deposition processes disclosed herein may deposit a hafnium lanthanum oxide film with precise control over the composition of the $HfLaO_x$ film as well as an improved uniformity in the composition of the $HfLaO_x$ film.

Therefore, embodiments of the disclosure may include methods for depositing a hafnium lanthanum oxide film on a substrate by a cyclical deposition process in a reaction chamber. In some embodiments, the cyclical deposition process may comprise: depositing a hafnium oxide film on the substrate utilizing at least one deposition cycle of a first sub-cycle of the cyclical deposition process, wherein one deposition cycle of the first sub-cycle comprises: contacting the substrate with a hafnium vapor phase precursor; and contacting the substrate with a first oxidizer precursor comprising water ($H_2O$). The methods of the disclosure may also comprise: depositing a lanthanum oxide film on the substrate utilizing at least one deposition cycle of a second sub-cycle of the cyclical deposition process, wherein one deposition cycle of the second sub-cycle comprises: contacting the substrate with a lanthanum vapor phase precursor; and contacting the substrate with a second oxidizer precursor comprising molecular oxygen ($O_2$).

A non-limiting example embodiment of a cyclical deposition process may include atomic layer deposition (ALD), wherein ALD is based on typically self-limiting reactions, whereby sequential and alternating pulses of reactants are used to deposit about one atomic (or molecular) monolayer of material per deposition cycle. The deposition conditions and precursors are typically selected to provide self-saturating reactions, such that an absorbed layer of one reactant leaves a surface termination that is non-reactive with the gas phase reactants of the same reactants. The substrate is subsequently contacted with a different precursor that reacts with the previous termination to enable continued deposition. Thus, each cycle of alternated pulses typically leaves no more than about one monolayer of the desired material. However, as mentioned above, the skilled artisan will recognize that in one or more ALD cycles more than one monolayer of material may be deposited, for example, if some gas phase reactions occur despite the alternating nature of the process.

A cyclical deposition process for depositing a hafnium lanthanum oxide film may comprise two or more sub-cycles, wherein each sub-cycle may comprise an ALD-type process for depositing two or more films, such as, for example, a hafnium oxide film and a lanthanum oxide film. In some embodiments, a first sub-cycle may comprise an ALD-type process for depositing a hafnium oxide film and one deposition cycle, i.e., a unit deposition cycle, may comprise exposing the substrate to a first precursor, removing any unreacted first precursor and reaction byproducts from the reaction chamber, and exposing the substrate to a second precursor, followed by a second removal step. In some embodiments, the first precursor of the first sub-cycle may comprise a hafnium vapor phase precursor ('the hafnium precursor") and second precursor of the first sub-cycle may comprise a first oxidizer precursor. In some embodiments, a second sub-cycle may also comprise an ALD-type process for depositing a lanthanum oxide film and one deposition cycle, i.e., a unit deposition cycle, may comprise exposing the substrate to a first precursor, removing any unreacted first precursor and reaction byproducts from the reaction chamber, and exposing the substrate to a second precursor, followed by a second removal step. In some embodiments, the first precursor of the second sub-cycle may comprise a lanthanum vapor phase precursor ('the lanthanum precursor") and the second precursor of the second sub-cycle may comprise a second oxidizer precursor.

Precursors may be separated by inert gases, such as argon (Ar) or nitrogen ($N_2$), to prevent gas-phase reactions between precursors and enable self-saturating surface reactions. In some embodiments, however, the substrate may be moved to separately contact a first precursor and a second precursor. Because the reactions self-saturate, strict temperature control of the substrates and precise dosage control of the precursors may not be required. However, the substrate temperature is preferably such that an incident gas species does not condense into monolayers nor decompose on the surface. Surplus chemicals and reaction byproducts, if any, are removed from the substrate surface, such as by purging the reaction space or by moving the substrate, before the substrate is contacted with the next reactive chemical. Undesired gaseous molecules can be effectively expelled from a reaction space with the help of an inert purging gas. A vacuum pump may be used to assist in the purging.

Reactors capable of being used to deposit hafnium lanthanum oxide films can be used for the deposition processes described herein. Such reactors include ALD reactors, as well as CVD reactors, configured to provide the precursors. According to some embodiments, a showerhead reactor may be used. According to some embodiments, cross-flow, batch, mini-batch, or spatial ALD reactors may be used.

In some embodiments of the disclosure, a batch reactor may be used. In some embodiments, a vertical batch reactor may be utilized. In other embodiments, the batch reactor comprises a mini-batch reactor configured to accommodate 10 or fewer wafers, 8 or fewer wafers, 6 or fewer wafers, 4 or fewer wafers, or 2 or fewer wafers. In some embodiments in which a batch reactor is used, wafer-to-wafer non-uniformity is less than 3% (1 sigma), less than 2%, less than 1%, or even less than 0.5%.

The deposition processes described herein may optionally be carried out in a reactor or reaction chamber connected to a cluster tool. In a cluster tool, because each reaction chamber is dedicated to one type of process, the temperature of the reaction chamber in each module can be kept constant, which improves the throughput compared to a reactor in which the substrate is heated up to the process temperature before each run. Additionally, in a cluster tool, it is possible to reduce the time to pump the reaction chamber to the desired process pressure levels between substrates. In some embodiments of the disclosure, the deposition process may be performed in a cluster tool comprising multiple reaction chambers, wherein each individual reaction chamber may be utilized to expose the substrate to an individual precursor gas and the substrate may be transferred between different reaction chambers for exposure to multiple precursors gases, the transfer of the substrate being performed under a controlled ambient to prevent oxidation/contamination of the substrate. In some embodiments of the disclosure, the deposition process may be performed in a cluster tool comprising multiple reaction chambers, wherein each individual reaction chamber may be configured to perform a different sub-cycle of the overall cyclical deposition process, i.e., the cyclical deposition super-cycle. For example, a first reaction chamber of the cluster tool may be configured to perform a first sub-cycle and a second reaction chamber of the cluster tool may be configured to perform a second sub-cycle, wherein the substrate may be transferred between the first reaction chamber and the second reaction chamber under a controlled environment to prevent unwanted contamination of the substrate and the oxide film thereon.

In certain embodiments, the reactor or reaction chamber may comprise a stand-alone reactor equipped with a load-lock. In such case, it is not necessary to cool down the reaction chamber between each run. In some embodiments, a deposition process for depositing a hafnium lanthanum oxide film may comprise a plurality of deposition cycles, i.e., a plurality of unit cycles, for example, ALD cycles or cyclical CVD cycles.

In some embodiments, one or more cyclical deposition processes may be used to deposit the $HfLaO_x$ films of the current disclosure on a substrate. In some embodiments, the cyclical deposition processes may comprise one or more ALD type processes. In certain embodiments, a cyclical deposition process may comprise one or more hybrid ALD/CVD or one or more cyclical CVD processes. For example, in some embodiments, the growth rate of an ALD process may be low compared with a CVD process. One approach to increase the growth rate may be by operating at a higher substrate temperature than that typically employed in an ALD process, resulting in at least a portion of the deposition being provided by a chemical vapor deposition type process, but still taking advantage of the sequential introduction of precursors. Such a process may be referred to as a cyclical CVD process. In some embodiments, a cyclical CVD process may comprise the introduction of two or more precursors into the reaction chamber, wherein a time period of overlap between the two or more precursors in the reaction chamber results in both an ALD component of the deposition and a CVD component of the deposition. For example, a cyclical CVD process may comprise the continuous flow of a one precursor and the periodic pulsing of a second precursor into a reaction chamber.

Figure 1:
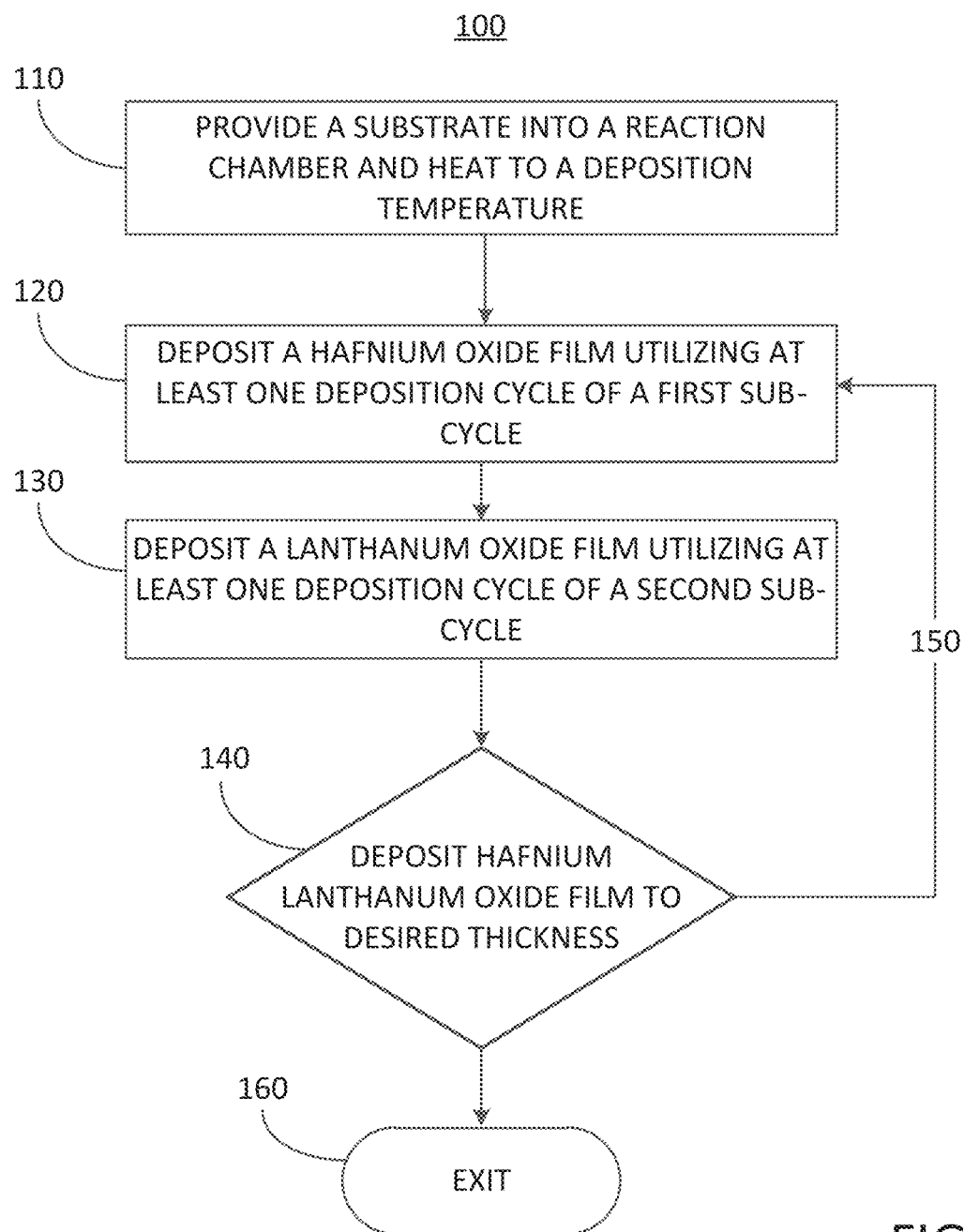
FIG. 1 illustrates a process flow representing an overall super-cycle of a cyclical deposition process according to embodiments of the disclosure.
Figure 2:
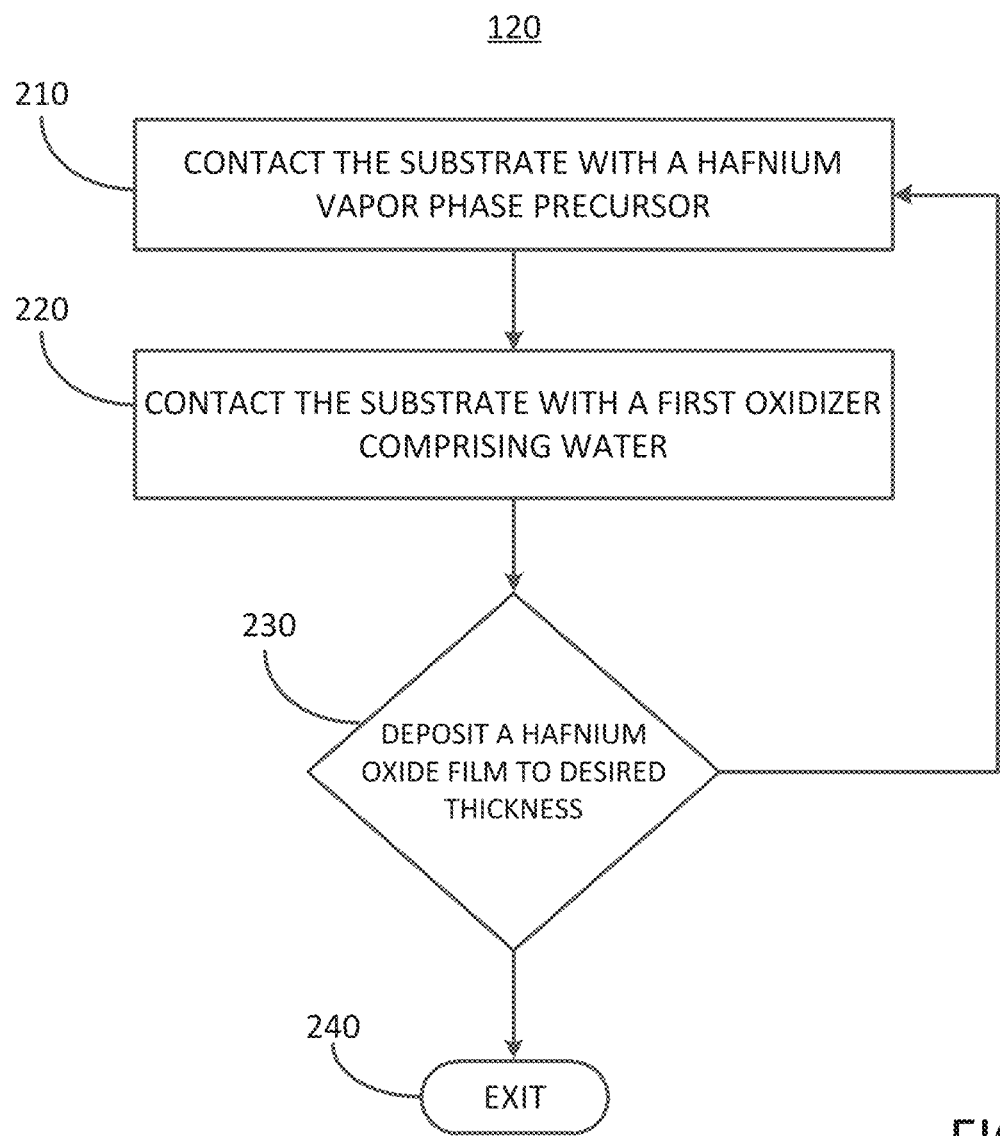
FIG. 2 illustrates a process representing a first sub-cycle of the cyclical deposition processes according to the embodiments of the disclosure.
Figure 3:
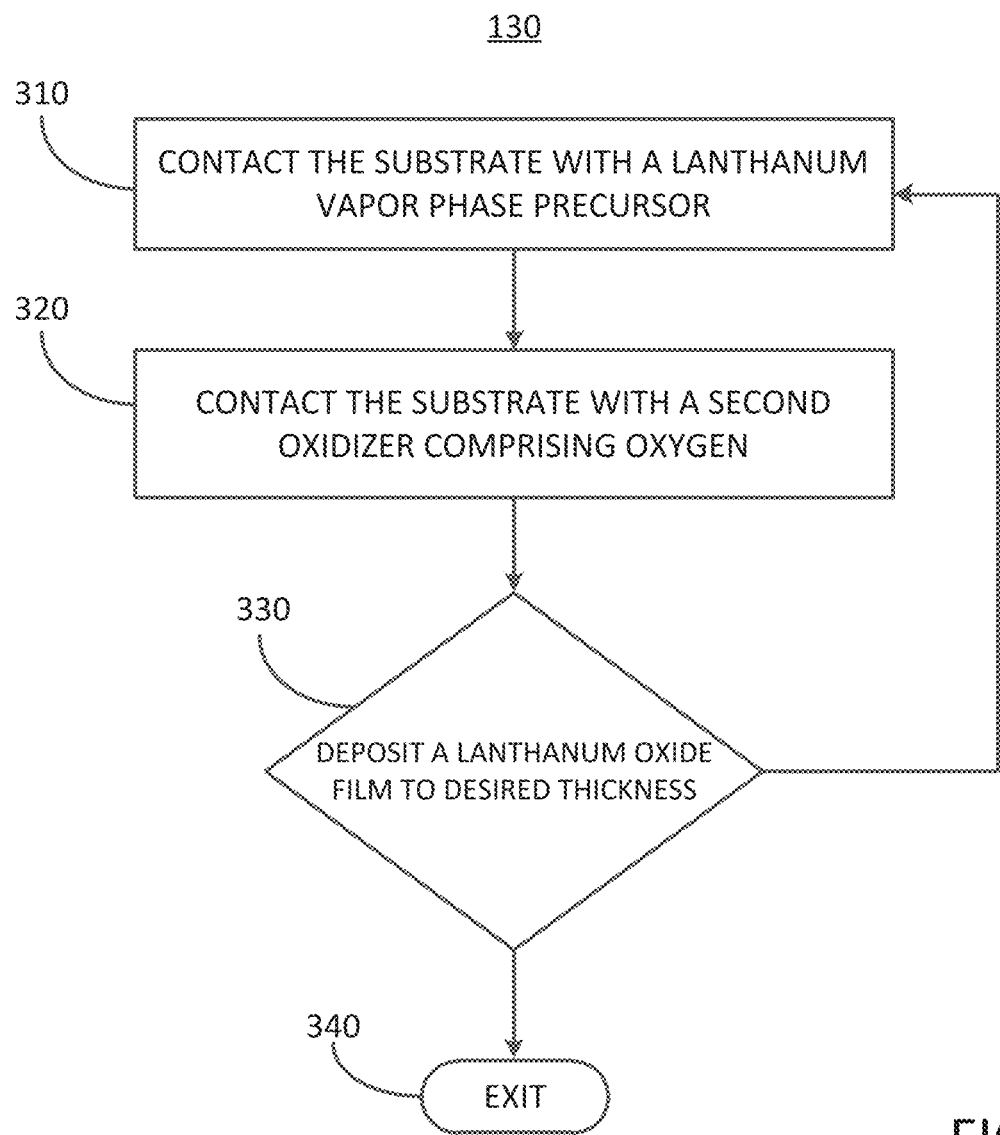
FIG. 3 illustrates a process representing a second sub-cycle of the cyclical deposition processes according to embodiments of the disclosure.

In some embodiments, a cyclical deposition process may be utilized to deposit a hafnium lanthanum oxide film and a non-limiting example of such a cyclical deposition process may be understood with reference to FIGS. 1-3, wherein FIG. 1 illustrates the overall exemplary cyclical deposition process including a cyclical deposition super-cycle; FIG. 2 illustrates an exemplary first sub-cycle for depositing a hafnium oxide film; and FIG. 3 illustrates an exemplary second sub-cycle for depositing a lanthanum oxide film.

In more detail, FIG. 1 illustrates an exemplary overall cyclical deposition process 100 including a cyclical deposition super-cycle 150 comprising, a first sub-cycle 120 and a second sub-cycle 130, utilized for the deposition of an $HfLaO_x$ film. In more detail, the overall cyclical deposition process 100 may commence by means of a process 110 which comprises providing a substrate into a reaction chamber and heating the substrate to a desired deposition temperature.

In some embodiments of the disclosure, the substrate may comprise a planar substrate or a patterned substrate including high aspect ratio features, such as, for example, trench structures and/or fin structures. The substrate may comprise one or more materials including, but not limited to, silicon (Si), germanium (Ge), germanium tin (GeSn), silicon germanium (SiGe), silicon germanium tin (SiGeSn), silicon carbide (SiC), or a group III-V semiconductor material, such as, for example, gallium arsenide (GaAs), gallium phosphide (GaP), or gallium nitride (GaN). In some embodiments of the disclosure, the substrate may comprise an engineered substrate wherein a surface semiconductor layer is disposed over a bulk support with an intervening buried oxide (BOX) disposed there between.

Patterned substrates may comprise substrates that may include semiconductor device structures formed into or onto a surface of the substrate, for example, a patterned substrate may comprise partially fabricated semiconductor device structures, such as, for example, transistors and/or memory elements. In some embodiments, the substrate may contain monocrystalline surfaces and/or one or more secondary surfaces that may comprise a non-monocrystalline surface, such as a polycrystalline surface and/or an amorphous surface. Monocrystalline surfaces may comprise, for example, one or more of silicon (Si), silicon germanium (SiGe), germanium tin (GeSn), or germanium (Ge). Polycrystalline or amorphous surfaces may include dielectric materials, such as oxides, oxynitrides or nitrides, such as, for example, silicon oxides and silicon nitrides.

The reaction chamber utilized for the deposition may be an atomic layer deposition reaction chamber, or a chemical vapor deposition reaction chamber, or any of the reaction chambers as previously described herein. In some embodiments of the disclosure, the substrate may be heated to a desired deposition temperature during the cyclical deposition process. For example, the substrate may be heated to a substrate temperature of less than approximately 750° C., or less than approximately 650° C., or less than approximately 550° C., or less than approximately 450° C., or less than approximately 350° C., or less than approximately 300° C., or less than approximately 250° C., or even less than approximately 150° C. In some embodiments of the disclosure, the substrate temperature during the cyclical deposition process may be between 100° C. and 400° C., or between 150° C. and 350° C., or between 200° C. and 300° C.

Upon heating the substrate to a desired deposition temperature, the exemplary cyclical deposition process 100 of FIG. 1 may continue with a cyclical deposition super-cycle 150 which comprises one or more repetitions of depositing a hafnium oxide film utilizing at least one deposition cycle of a first sub-cycle and depositing a lanthanum oxide film utilizing at least one deposition cycle of a second sub-cycle. The cyclical deposition super-cycle 150 may commence by means of a process block 120, which comprises depositing a hafnium oxide film utilizing at least one deposition cycle of a first sub-cycle.

FIG. 2 illustrates the first sub-cycle 120 and its constituting sub-processes in greater detail. For example, the first sub-cycle 120 may commence by means of a sub-process block 210 comprising: contacting or exposing the substrate with a hafnium vapor phase reactant ("the hafnium precursor").

In some embodiments, the hafnium precursor may comprise at least one of a hafnium halide precursor, a hafnium metalorganic precursor, or an organometallic hafnium precursor.

In some embodiments, the hafnium halide precursor may comprise at least one halide ligand while the rest of the ligands are different, such as metalorganic or organometallic ligands as described later herein. In some embodiments, the hafnium halide precursor may comprise one, two, three, or four halide ligands, such as chloride ligands.

In some embodiments, the hafnium halide precursor may comprise at least one of a hafnium chloride, a hafnium iodide, or a hafnium bromide. In some embodiments, the hafnium chloride may comprise hafnium tetrachloride (HfCl$_4$). In some embodiments, the hafnium iodide may comprise hafnium tetraiodide (HfI$_4$). In some embodiments, the hafnium bromide may comprise hafnium tetrabromide (HfBr$_4$).

In some embodiments, the hafnium metalorganic precursor may comprise at least one of a hafnium alkylamide precursor, a hafnium cyclopentadienyl-ligand containing precursor, or other metalorganic hafnium precursors.

In some embodiments, the hafnium alkylamide precursor may be selected from the group comprising tetrakis(ethylmethylamido)hafnium (Hf(NEtMe)$_4$), tetrakis(dimethylamido)hafnium (Hf(NMe$_2$)$_4$), or tetrakis(diethylamido)hafnium (Hf(NEt$_2$)$_4$).

In some embodiments of the disclosure, the hafnium cyclopentadienyl-ligand containing precursor may be selected from the group comprising tris(alkylamido)cyclopentadienylhafnium, such as tris(dimethylamido)cyclopentadienylhafnium (HfCp(NMe$_2$)$_3$), or bis(methylcyclopentadienyl)methoxymethyl hafnium ((MeCp)$_2$Hf(CH)$_3$(OCH$_3$)) or derivatives of those, such as ones in which there is one or more hydrocarbons, such as alkyls, attached to the cyclopentadienyl-ligand of those precursors, or other alkyl groups in alkylamido-ligand.

In some embodiments, the hafnium precursor may have the formula:

$$HfL_1L_2L_3L_4$$

wherein each of the L ligands through L1-L4 can be independently selected to be:
a) Halide, such as chloride, bromide or iodide;
b) Alkylamido, such as dimethylamido (—NMe2), diethylamido (—NEt2), ethylmethylamido (—NEtMe);
c) Amidinate, such as N.N-dimethylformamidinate;
d) Guanidinate, such as N.N'-diisopropyl-2-ethylmethylamidoguanidinate;
e) Cyclopentadienyl or derivatives of those, such as cyclopentadienyl or methylcyclopentadienyl or other alkylsubstituted cyclopentadienyl ligands;
f) Cycloheptadienyl or -trienyl-based, such as a cycloheptatrienyl or cycloheptadienyl
g) Alkyl, such as C1-C5 alkyl, for example methyl, mostly in case of heteroleptic precursors;
h) Alkoxide, such as methoxide (—OMe), ethoxide (—OEt), isopropoxide (—O$^i$Pr), n-butoxide (—OBu) or tert-butoxide (—O$^t$Bu),
i) Betadiketonate, such as (2,2,6,6-tetramethyl-3,5-heptanedionato (thd); and/or
j) Donor-functionalized alkoxide, such as dimethylethanolamine.

In some embodiments of the disclosure, the hafnium precursor comprises one or more bidentate ligands which are bonded to Hf through nitrogen and/or oxygen atoms. In some embodiments, the hafnium precursor comprises one or more ligands which are bonded to Hf through nitrogen, oxygen, and/or carbon.

In some embodiments of the disclosure, the hafnium precursor does not comprise a plasma excited precursor, i.e., the hafnium oxide film is deposited without plasma excitation of the precursor, in other words the hafnium oxide film is deposited in a plasma free environment.

In some embodiments of the disclosure, contacting the substrate with the hafnium vapor phase precursor may comprise pulsing the hafnium precursor into the reaction chamber and subsequently contacting the hafnium precursor to the substrate for a time period of between about 0.01 seconds and about 60 seconds, or between about 0.05 seconds and about 10 seconds, or between about 0.1 seconds and about 5.0 seconds. In addition, during the pulsing of the hafnium precursor, the flow rate of the hafnium precursor may be less than 2000 sccm, or less than 500 sccm, or even less than 100 sccm. In addition, during the pulsing of the hafnium precursor over the substrate the flow rate of the hafnium precursor may range from about 1 to 2000 sccm, or from about 5 to 1000 sccm, or from about 10 to about 500 sccm.

The exemplary sub-cycle 120 of FIG. 2 may continue by purging the reaction chamber. For example, excess hafnium precursor and reaction byproducts (if any) may be removed from the surface of the substrate, e.g., by pumping with an inert gas. In some embodiments of the disclosure, the purge process may comprise a purge cycle wherein the substrate surface is purged for a time period of less than approximately 5.0 seconds, or less than approximately 3.0 seconds, or even less than approximately 2.0 seconds. Excess hafnium vapor phase reactant and any possible reaction byproducts may be removed with the aid of a vacuum, generated by a pumping system in fluid communication with the reaction chamber.

Upon purging the reaction chamber with a purge cycle the exemplary cyclical deposition sub-cycle 120 may continue with a sub-process block 220 comprising: contacting or exposing the substrate with a first oxidizer precursor and particularly contacting the substrate with a first oxidizer precursor that comprises water ($H_2O$). In alternative embodiments, the first oxidizer precursor comprises at least one of hydrogen peroxide ($H_2O_2$), ozone ($O_3$), or oxides of nitrogen, such as, for example, nitrogen monoxide (NO), nitrous oxide ($N_2O$), or nitrogen dioxide ($NO_2$). In some embodiments of the disclosure, the oxidizer precursor may comprise an organic alcohol, such as, for example, isopropyl alcohol.

In some embodiments of the disclosure, the first oxidizer precursor does not comprise a plasma excited precursor, i.e., the hafnium oxide film is deposited without plasma excitation of the precursor. In other words, in certain embodiments, the hafnium oxide film is deposited in a plasma free environment.

In some embodiments of the disclosure, contacting the substrate with the first oxidizer precursor may comprise pulsing the first oxidizer precursor, e.g., water ($H_2O$), into the reaction chamber and subsequently contacting the substrate to the first oxidizer precursor for a time period of between about 0.01 seconds and about 60 seconds, or between about 0.05 seconds and about 10 seconds, or between about 0.1 seconds and about 5.0 seconds. In addition, during the pulsing of the first oxidizer precursor, the flow rate of the first oxidizer precursor may be less than 2000 sccm, or less than 500 sccm, or even less than 100 sccm. In addition, during the pulsing of the first oxidizer precursor over the substrate the flow rate of the first oxidizer precursor may range from about 1 to 2000 sccm, from about 5 to 1000 sccm, or from about 10 to about 500 sccm.

In embodiments wherein the first oxidizer precursor comprises water ($H_2O$), the purity of the water may be characterized by its electrical resistivity, for example, the higher the electrical resistivity of the water the greater the purity and hence the incorporation of unwanted contaminants in the deposited film may be reduced. In some embodiments, the first oxidizer precursor may comprise water ($H_2O$) with an electrical resistivity of greater than 5 MΩ-cm, or greater than 10 MΩ-cm, or greater than 15 MΩ-cm, or even greater than 20 MΩ-cm. In some embodiments of the disclosure, the electrical resistivity of the water utilized in the deposition of a hafnium oxide film may be between 5 MΩ-cm and 20 MΩ-cm.

The exemplary sub-cycle 120 of FIG. 2 may continue by purging the reaction chamber. For example, excess first oxidizer precursor and reaction byproducts (if any) may be removed from the surface of the substrate, e.g., by pumping with an inert gas. In some embodiments of the disclosure, the purge process may comprise a purge cycle wherein the substrate surface is purged for a time period of less than approximately 5.0 seconds, or less than approximately 3.0 seconds, or even less than approximately 2.0 seconds. Excess first oxidizer precursor, e.g., water, and any possible reaction byproducts may be removed with the aid of a vacuum, generated by a pumping system in fluid communication with the reaction chamber.

The sub-cycle 120 of FIG. 2 may continue by means of a sub-process block 230 which comprises a decision gate, the decision gate being dependent on the thickness of the hafnium oxide film to be deposited by the exemplary first sub-cycle 120. If the hafnium oxide film deposited is at an insufficient thickness for subsequent process steps then the cyclical sub-cycle 120 may return to the sub-process block 210, and the substrate may be contacted with the hafnium vapor phase precursor (sub-process block 210) and contacted with the first oxidizer precursor (sub-process block 220). For example, a single deposition cycle, i.e. a unit deposition cycle, of the first sub-cycle 120 may comprise: contacting the substrate with a hafnium precursor, purging the reaction chamber, contacting the substrate with water, and purging the reaction chamber again. To deposit a hafnium oxide film to a desired thickness, the sub-cycle 120 may be repeated one or more times until a desired thickness of a hafnium oxide film is deposited, at which point the exemplary first sub-cycle may exit via a sub-process block 240.

It should be appreciated that in some embodiments of the disclosure, the order of contacting of the substrate with the hafnium precursor and the first oxidizer precursor may be such that the substrate is first contacted with the first oxidizer precursor followed by the hafnium precursor. In addition, in some embodiments, the cyclical deposition sub-cycle 120 may comprise, contacting the substrate with the hafnium precursor one or more times prior to contacting the substrate with the first oxidizer precursor one or more times. In some embodiments, the cyclical deposition sub-cycle 120 may comprise, contacting the substrate with the first oxidizer precursor one or more times prior to contacting the substrate with the hafnium precursor one or more times.

In some embodiments of the disclosure, the exemplary cyclical first sub-cycle 120 alternatingly contacts the substrate with a hafnium precursor and a first oxidizer precursor and the reaction between the hafnium precursor and the first oxidizer precursor, e.g., water, may deposit a hafnium oxide film over a surface of the substrate.

In some embodiments of the disclosure, the exemplary cyclical deposition sub-cycle 120 may not be repeated and only a single unit cycle, i.e., one deposition cycle, of the deposition process may be performed. For example, the substrate may be contacted with the hafnium precursor and subsequently contacted with the first oxidizer precursor to deposit a single monolayer, or less than a single monolayer, of a hafnium oxide film, i.e., in some embodiments, the hafnium oxide film comprises a single monolayer or less than a single monolayer. In such embodiments wherein one deposition cycle is utilized for the deposition of the hafnium oxide film, the hafnium oxide film may have a thickness of less than 5 Angstroms, or less than 2 Angstrom, or even less than 1 Angstrom. In some embodiments, the hafnium oxide film may not comprise a continuous film, but may rather comprising a plurality of isolated regions of hafnium oxide disposed over the substrate.

In some embodiments of the disclosure, the exemplary cyclical deposition sub-cycle 120 may be repeated one or more times to deposit a hafnium oxide film to a desired thickness. In some embodiments of the disclosure, a unit deposition cycle of the first sub-cycle 120 may comprise: contacting the substrate with the hafnium precursor, purging the reaction chamber, contacting the substrate with the first oxidizer precursor, and again purging the reaction chamber. In some embodiments of the disclosure, a unit deposition cycle of sub-cycle 120 may be performed greater than 2 times, or greater than 4 times, or greater than 6 times, or greater than 8 times, or greater than 10 times, or greater than 15 times, or greater than 20 times. In some embodiments, the unit deposition cycle may be repeated to deposit a hafnium oxide film to a thickness of less than 3 nanometers, or less than 2 nanometers, or less than 1 nanometer, or less than 5 Angstroms, or even less than 2 Angstroms. In some embodiments, the hafnium oxide film may not comprise a continuous film but may rather comprising a plurality of isolated regions of hafnium oxide disposed over the substrate.

Upon completion of process block 120, i.e., the first sub-cycle, the cyclical deposition super-cycle 150 (FIG. 1) may continue by a process block 130 comprising, depositing a lanthanum oxide film utilizing at least one deposition cycle of a second sub-cycle.

FIG. 3 illustrates the second sub-cycle 130 and its constituent sub-processes in greater detail, wherein the second sub-cycle 130 may commence by means of a sub-process block 310 comprising: contacting or exposing the substrate with a lanthanum vapor phase precursor ('the lanthanum precursor").

In some embodiments of the disclosure, the lanthanum precursor may comprise an amidinate based precursor, such as, for example, lanthanum formamidinate $(La(FAMD)_3)$ or tris(N,N'-diisopropylacetamidinato)lanthanum $(La(iPrAMD)3)$. In some embodiments, the lanthanum precursor may comprise a diketonate precursor, such as, $(La(THD)_3)$, for example. In some embodiments, the lanthanum precursor may comprise a Cp(cyclopentadienyl)-based precursor, such as Tris(isopropyl-cyclopentadienyl)lanthanum $(La(iPrCp)_3)$, for example. In some embodiments, the lanthanum precursor may comprise an amido-based chemistry such as tris(bist-rimethylsilylamido)-lanthanum $(La[N(SiMe_3)_2]_3)$, for example.

In some embodiments, the lanthanum precursor may comprise hybrid combinations of the above. In other embodiments, the lanthanum precursor may comprise a lanthanum precursor having a bond between nitrogen, such as a lanthanum amidinate, for example. The amidinate compounds may comprise delocalized electrons that result in the bond between the nitrogen and the lanthanum. In other embodiments, the lanthanum precursor may comprise a lanthanum precursor having a bond with carbon, such as a lanthanum cyclopentadienyl, for example. In such embodiments, the lanthanum precursor may comprise delocalized electrons, which are considered to be compounds in which a bond between the carbon and the lanthanum forms. In other embodiments, the lanthanum precursor may comprise a lanthanum precursor having a bond with both nitrogen and carbon, such as a lanthanum amidinate and a lanthanum cyclopentadienyl compound, for example.

In some embodiments of the disclosure, the lanthanum precursor does not comprise a plasma excited precursor, i.e., the lanthanum oxide film may be deposited without plasma excitation of the precursor, in other words the lanthanum oxide film may be deposited in a plasma free environment.

In some embodiments, contacting the substrate with a lanthanum vapor phase reactant may comprise pulsing the lanthanum precursor into the reaction chamber and subsequently contacting the lanthanum precursor with the substrate for a time period of between about 0.01 seconds and about 60 seconds, or between about 0.05 seconds and about 10 seconds, or between about 0.1 seconds and about 5.0 seconds. In addition, during the pulsing of the lanthanum precursor into the reaction chamber, the flow rate of the lanthanum precursor may be less than 2000 sccm, or less than 500 sccm, or even less than 100 sccm. In addition, during the pulsing of the lanthanum precursor into the reaction chamber and over the substrate, the flow rate of the lanthanum precursor may range from about 1 to 2000 sccm, or from about 5 to 1000 sccm, or from about 10 to about 500 sccm.

The exemplary sub-cycle 130 of FIG. 3 may continue by purging the reaction chamber. For example, excess lanthanum vapor phase reactant and reaction byproducts (if any) may be removed from the surface of the substrate, e.g., by pumping with an inert gas. In some embodiments of the disclosure, the purge process may comprise a purge cycle wherein the substrate surface is purged for a time period of less than approximately 5.0 seconds, or less than approximately 3.0 seconds, or even less than approximately 2.0 seconds. Excess lanthanum precursor and any possible reaction byproducts may be removed with the aid of a vacuum, generated by a pumping system in fluid communication with the reaction chamber.

Upon purging the reaction chamber with a purge cycle, the exemplary cyclical deposition sub-cycle 130 may continue with a sub-process block 320 comprising, contacting or exposing the substrate with a second oxidizer precursor, and particularly with a second oxidizer precursor comprising molecular oxygen $(O_2)$. In alternative embodiments, the second oxidizer precursor may comprise at least one of water $(H_2O)$, hydrogen peroxide $(H_2O_2)$, ozone $(O_3)$, or oxides of nitrogen, such as, for example, nitrogen monoxide (NO), nitrous oxide $(N_2O)$, or nitrogen dioxide $(NO_2)$. In some embodiments of the disclosure, the oxidizer precursor may comprise an organic alcohol, such as, for example, isopropyl alcohol.

In some embodiments of the disclosure, the second oxidizer precursor, e.g., molecular oxygen $(O_2)$, does not comprise a plasma excited precursor, i.e., the lanthanum oxide film is deposited without plasma excitation of the precursor; in other words, the lanthanum oxide film is deposited in a plasma free environment.

In embodiments wherein the second oxidizer precursor comprises molecular oxygen $(O_2)$, a high purity source of molecular oxygen $(O_2)$ may be utilized to substantially prevent unwanted contamination of the deposited lanthanum oxide film. Therefore, in some embodiments, the molecular oxygen $(O_2)$ may have a purity greater than 99.99%, or greater than 99.999%, or greater than 99.9999%, or even greater than 99.99999%.

In some embodiments of the disclosure, contacting the substrate with the second oxidizer precursor, e.g., molecular oxygen $(O_2)$, may comprise pulsing the second oxidizer precursor into the reaction chamber and subsequently contacting the substrate with the second oxidizer precursor for a time period of between about 0.01 seconds and about 60 seconds, or between about 0.05 seconds and about 10 seconds, or between about 0.1 seconds and about 5.0 seconds. In addition, during the pulsing of the second oxidizer precursor into the reaction chamber, the flow rate of the second oxidizer precursor may be less than 2000 sccm, or less than 500 sccm, or even less than 100 sccm. In addition, during the pulsing of the second oxidizer precursor over the substrate, the flow rate of the second oxidizer precursor may range from about 1 to 2000 sccm, or from about 5 to 1000 sccm, or from about 10 to about 500 sccm.

The exemplary sub-cycle 130 of FIG. 3 may continue by purging the reaction chamber. For example, excess second oxidizer precursor and reaction byproducts (if any) may be removed from the surface of the substrate, e.g., by pumping with an inert gas. In some embodiments of the disclosure, the purge process may comprise a purge cycle wherein the substrate surface is purged for a time period of less than approximately 5.0 seconds, or less than approximately 3.0 seconds, or even less than approximately 2.0 seconds. Excess second oxidizer precursor and any possible reaction byproducts may be removed with the aid of a vacuum, generated by a pumping system in fluid communication with the reaction chamber.

The sub-cycle 130 of FIG. 3 may continue by a sub-process block 330 which comprises a decision gate, the decision gate being dependent on the thickness of the lanthanum oxide film to be deposited by the exemplary second sub-cycle 130. If the lanthanum oxide film deposited is at an insufficient thickness for subsequent process steps, then the cyclical sub-cycle 130 may return to the sub-process block 310, and the substrate may be contacted with the lanthanum precursor (sub-process block 310) and contacted with the second oxidizer precursor, e.g., molecular oxygen ($O_2$) (sub-process block 320). For example, a single deposition cycle, i.e. a unit deposition cycle, of the second sub-cycle 130 may comprise: contacting the substrate with the lanthanum vapor phase reactant, purging the reaction chamber, contacting the substrate with the second oxidizer precursor, and purging the reaction chamber again. To deposit a lanthanum oxide film to a desired thickness the sub-cycle 130 may be repeated one or more times until a desired thickness of a lanthanum oxide film is deposited on the substrate, at which point the exemplary second sub-cycle 130 may exit via a sub-process block 340.

It should be appreciated that in some embodiments of the disclosure, the order of contacting of the substrate with the lanthanum precursor and the second oxidizer precursor may be such that the substrate is first contacted with the second oxidizer precursor followed by the lanthanum precursor. In addition, in some embodiments, the cyclical deposition second sub-cycle 130 may comprise, contacting the substrate with the lanthanum precursor one or more times prior to contacting the substrate with the second oxidizer precursor one or more times. In some embodiments, the cyclical deposition second sub-cycle 130 may comprise, contacting the substrate with the second oxidizer precursor one or more times prior to contacting the substrate with the lanthanum precursor one or more times.

In some embodiments of the disclosure, the exemplary cyclical sub-cycle 130 alternatingly contacts the substrate with a lanthanum precursor and a second oxidizer precursor, and the reaction between the lanthanum precursor and the second oxidizer precursor may deposit a lanthanum oxide film over the substrate.

In some embodiments of the disclosure, the exemplary cyclical deposition sub-cycle 130 may not be repeated and only a single unit cycle, i.e., one deposition cycle, of the deposition process may be performed. For example, the substrate may be contacted with the lanthanum precursor and subsequently contacted with the second oxidizer precursor to deposit a single monolayer, or less than a single monolayer, of a lanthanum oxide film, i.e., in some embodiments the lanthanum oxide film comprises a single monolayer or less than a single monolayer. In such embodiments wherein one deposition cycle is utilized for the deposition of the lanthanum oxide film, the lanthanum oxide film may have a thickness of less than 5 Angstroms, or less than 2 Angstrom, or even less than 1 Angstrom. In some embodiments, the lanthanum oxide film may not comprise a continuous film but may rather comprising a plurality of isolated regions of lanthanum oxide disposed over the substrate.

In some embodiments of the disclosure, the exemplary cyclical deposition sub-cycle 130 may be repeated one or more times to deposit a lanthanum oxide film to a desired thickness. In some embodiments of the disclosure, a unit deposition cycle of the second sub-cycle 130 may comprise: contacting the substrate with the lanthanum precursor, purging the reaction chamber, contacting the substrate with the second oxidizer precursor, and again purging the reaction chamber. In some embodiments of the disclosure, a unit deposition cycle of sub-cycle 130 may be performed greater than 2 times, or greater than 4 times, or greater than 6 times, or greater than 8 times, or greater than 10 times, or greater than 15 times, or greater than 20 times, or even greater. In some embodiments, the unit deposition cycle may be repeated to deposit a lanthanum oxide film to a thickness of less than 3 nanometers, or less than 2 nanometers, or less than 1 nanometer, or less than 5 Angstroms, or even less than 2 Angstroms. In some embodiments, the lanthanum oxide film may not comprise a continuous film but may rather comprising a plurality of isolated regions of lanthanum oxide disposed over the substrate.

Upon completion of the second sub-cycle 130, the exemplary cyclical deposition process 100 of FIG. 1 may continue by means of a process block 140 comprising a decision gate, wherein the decision gate is dependent on the total thickness of the hafnium lanthanum oxide film deposited by the first sub-cycle and the second sub-cycle. If the total thickness of the hafnium lanthanum oxide film is insufficient for the desired semiconductor device application then the cyclical deposition super-cycle 150 may be repeated by returning to the process block 120 and depositing a hafnium oxide film utilizing at least one deposition cycle of the first sub-cycle and subsequently utilizing the process block 130 to deposit a lanthanum oxide film utilizing at least one deposition cycle of the second sub-cycle, thereby depositing alternating layers of hafnium oxide and lanthanum oxide. Therefore, the cyclical deposition super-cycle 150 may be repeated one or more times until a desired thickness of a hafnium lanthanum oxide film is deposited over the substrate. Once the desired thickness of the hafnium lanthanum oxide film is achieved the exemplary cyclical deposition process 100 may exit via a process block 160 and the substrate with the hafnium lanthanum oxide film disposed thereon may be subjected to further semiconductor device fabrication processes.

It should be appreciated that in some embodiments of the disclosure, the order of depositing the hafnium oxide film and the lanthanum oxide film on the substrate may be such that the cyclical deposition super-cycle 150 comprises first depositing a lanthanum oxide film followed by depositing a hafnium oxide film and then, if necessary, repeating the steps of lanthanum oxide deposition and hafnium oxide deposition to result in the deposition of a hafnium lanthanum oxide film.

In some embodiments of the disclosure, the method of depositing a hafnium lanthanum oxide film comprises both a deposition process for depositing a hafnium oxide film or component (e.g., one or more first sub-cycles), and depositing a lanthanum oxide film or component (e.g., one or more second sub-cycles). For example, a method for depositing a hafnium lanthanum oxide film encompassed by the present disclosure may include a number of super-cycles 150 which include one or more hafnium oxide ($HfO_x$) deposition sub-cycles and one or more lanthanum oxide ($LaO_x$) deposition sub-cycles.

In some embodiments, certain properties of the deposited hafnium lanthanum oxide film may be controlled by varying the ratio of the number of performed first sub-cycles ($HfO_x$ sub-cycles) to the number of performed second sub-cycles ($LaO_x$ sub-cycles) within an individual super-cycle. In other words, the exemplary cyclical deposition process 100 may comprise a ratio of first sub-cycles performed to second sub-cycles performed per unit super-cycle. Alternatively, the exemplary cyclical deposition process 100 may comprise a ratio of second sub-cycles performed to first sub-cycles performed per unit super-cycle. In some embodiments, the ratio of second sub-cycles ($LaO_x$ sub-cycles) performed to first sub-cycles ($HfO_x$ sub-cycles) performed per super-cycle is less than 0.50, or less than 0.40, or less than 0.30, or less than 0.20, or less than 0.15, or less than 0.10, or even less than 0.05.

In some embodiments, one or more deposition parameters of a first sub-cycle ($LaO_x$ sub-cycle) may be different from that of another first sub-cycle ($LaO_x$ sub-cycle) within a given super-cycle or between consecutive super-cycles. In some embodiments, one or more deposition parameters of a second sub-cycle ($HfO_x$ sub-cycle) may be different from that of another second sub-cycle ($HfO_x$ sub-cycle) within a given super-cycle or between consecutive super-cycles. In some embodiments, the deposition parameters of a first sub-cycle or a second sub-cycle may be substantially identical throughout the deposition process, i.e., over one or more consecutive super-cycles.

Figure 4:
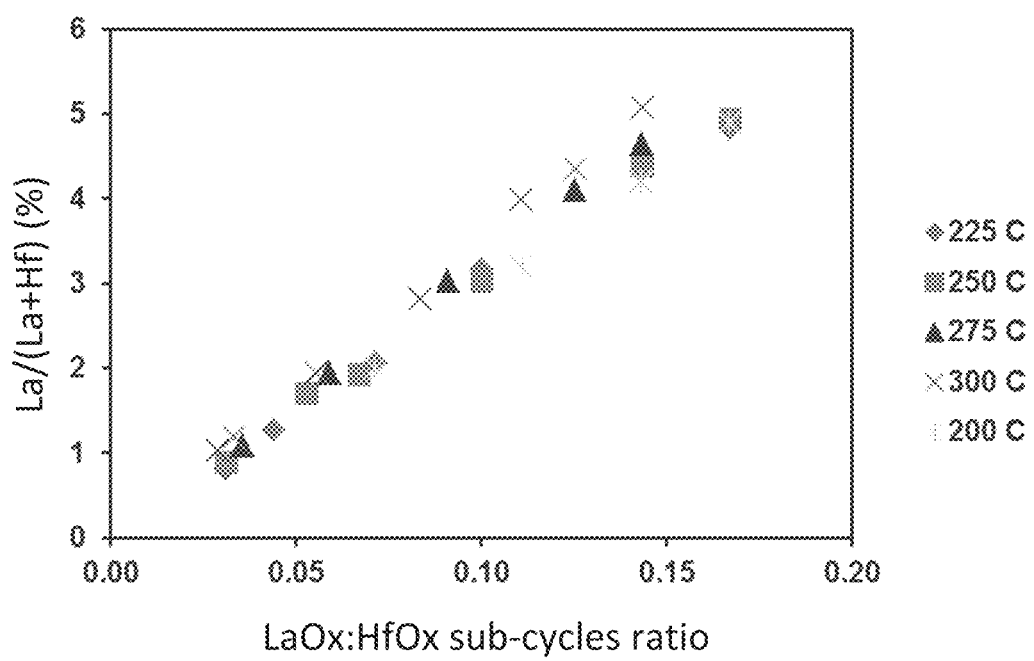
FIG. 4 illustrates x-ray photoelectron spectroscopy (XPS) data showing the change in lanthanum composition for a number of exemplary hafnium lanthanum oxide films in relation to the ratio of lanthanum oxide deposition sub-cycles to hafnium oxide deposition sub-cycles according to embodiments of the disclosure.

In some embodiments of the disclosure, the ratio of second sub-cycles ($LaO_x$ sub-cycles) performed to first sub-cycles ($HfO_x$ sub-cycles) performed per super-cycle may be utilized to control the composition of the hafnium lanthanum oxide film, such as, the lanthanum composition (atomic-%) in the hafnium lanthanum oxide film, for example. In more detail, FIG. 4 illustrates x-ray photoelectron spectroscopy (XPS) data showing the change in lanthanum composition (atom-%) for a number of exemplary hafnium lanthanum oxide films in relation to the ratio of lanthanum oxide deposition sub-cycles to hafnium oxide deposition sub-cycles according to the embodiments of the disclosure. Examination of FIG. 4 shows a clear relationship between the $LaO_x$:$HfO_x$ sub-cycle ratio and the lanthanum composition (atomic-%) present within the exemplary $HfLaO_x$ films. For example, as the $LaO_x$:$HfO_x$ sub-cycle ratio decreases, the lanthanum composition within the exemplary $HfLaO_x$ films also decreases. Embodiments of the disclosure therefore may provide a method to tightly the control the composition of a deposited hafnium lanthanum oxide film. For example, the hafnium lanthanum oxide films deposited according to the embodiments of the disclosure may have a lanthanum composition of less than 10 atomic-%, or less than 7 atomic-%, or less than 5 atomic-%, or less than 3 atomic-%, or less than 2 atomic-%, or even equal to or less than 1 atomic-%. In some embodiments, the lanthanum composition in the hafnium lanthanum oxide films deposited according to the embodiments of the disclosure may be between 0.5 atomic-% and 3 atomic-%, or between 1.0 atomic-% and 2.5 atomic-%.

In some embodiments of the disclosure, the hafnium lanthanum oxide film may be deposited with a low concentration of impurities. For example, the hafnium lanthanum oxide film may be deposited with an impurity concentration of less than 10 atomic-%, or less than 5 atomic-%, or less than 2 atomic-%, or less than 1 atomic-%, or less than 0.5 atomic-%, or even less than 0.2 atomic-%. In some embodiments, the impurities within the hafnium lanthanum oxide film may include, but are not limited to, carbon. For example, the hafnium lanthanum oxide film may be deposited with a carbon concentration of less than 10 atomic-%, or less than 5 atomic-%, or less than 2 atomic-%, or less than 1 atomic-%, or less than 0.5 atomic-%, or even less than 0.2 atomic-%.

In some embodiments, the methods of the disclosure may deposit hafnium lanthanum oxide films with a greater compositional uniformity due to a reduction in the hygroscopicity of the deposition process enabled by utilizing two different oxidizer precursors for the hafnium oxide deposition sub-cycles and the lanthanum oxide deposition sub-cycles. In some embodiments of the disclosure, the lanthanum composition uniformity in the hafnium lanthanum oxide films deposited according to the embodiments of the disclosure may be less than 2 atomic-% (1-sigma), or less than 0.5 atomic-% (1-sigma), or less than 0.2 atomic-% (1-sigma), or less than 0.1 atomic-% (1-sigma). In some embodiments of the disclosure, the lanthanum composition uniformity in the hafnium lanthanum oxide films deposited according to the embodiments of the disclosure may be between 2 atomic-% (1-sigma) and 0.1 atomic-% (1-sigma). In the embodiments disclosed herein, the atomic concentration of an element may be determined utilizing Rutherford backscattering (RBS) or x-ray photoelectron spectroscopy (XPS).

In some embodiments, the hafnium lanthanum oxide deposited according to methods disclosed herein may comprise a nanolaminate film. That is, in some embodiments, separate and distinct layers may be visible within the hafnium lanthanum oxide film. For example, the hafnium lanthanum oxide film may comprise a nanolaminate including alternating layers of hafnium oxide and lanthanum oxide.

In some embodiments, the hafnium lanthanum oxide deposited according to methods disclosed herein is not a nanolaminate film. That is, in some embodiments, separate and distinct layers may not be visible within the hafnium lanthanum oxide film deposited according to the embodiments of the disclosure. For example, a uniform or substantially compositionally uniform hafnium lanthanum oxide film may be deposited by the methods disclosed herein. In some embodiments, the hafnium lanthanum oxide film comprises a substantially compositionally uniform tertiary hafnium lanthanum oxide film.

In more detail, in some embodiments of the disclosure, the hafnium lanthanum oxide films deposited by the cyclical deposition processes described herein may comprise substantially compositionally uniform hafnium lanthanum oxide film. For example, the cyclical deposition processes described herein may alternatingly deposit a hafnium oxide film and a lanthanum oxide film (or vice versa). However, since, in some embodiments, the hafnium oxide and lanthanum oxide films may deposited to a thickness of less than 5 Angstroms, the alternating layers may inter diffuse resulting in a substantially compositionally uniform hafnium lanthanum oxide film, i.e., no discernable distinction in the hafnium lanthanum oxide film exists between hafnium oxide regions and lanthanum oxide regions.

In some embodiments, the hafnium lanthanum oxide films of the present disclosure may be deposited to a thickness from 20 nanometers to 0.5 nanometers, or from 15 nanometers to 1 nanometer, or from 10 nanometers to 1.5 nanometers. In some embodiments, the hafnium lanthanum oxide films of the present disclosure may be deposited to a thickness of less than 20 nanometers, or less than 15 nanometers, or less than 10 nanometers, or less than 8 nanometers, or even less than 5 nanometers.

In some embodiments of the disclosure, the growth rate of the hafnium lanthanum oxide film may be from 0.1 Å/cycle to about 5 Å/cycle, or from 0.2 Å/cycle to 3 Å/cycle, or from 0.3 Å/cycle to 2.0 Å/cycle. In some embodiments the growth rate of the hafnium lanthanum oxide film is more than 0.3 Å/cycle, or more than 0.5 Å/cycle, or more than 0.8 Å/cycle or more than 1.0 Å/cycle, or more than 1.2 Å/cycle. In some embodiments the growth rate of the hafnium lanthanum oxide film is less than 1.5 Å/cycle, or less than 1.0 Å/cycle, or less than 0.5 Å/cycle, or less than 0.3 Å/cycle, or less than 0.2 Å/cycle. The growth rates recited herein is based on the number of combined both $HfO_x$ and $LaO_x$ sub-cycles i.e., cycle means either $HfO_x$ or $LaO_x$ sub-cycle.

The hafnium lanthanum oxide films deposited by the cyclical deposition processes disclosed herein may be continuous films. In some embodiments, the hafnium lanthanum oxide film may be continuous at a thickness below 100 nanometers, or below 60 nanometers, or below 50 nanometers, or below 40 nanometers, or below 30 nanometers, or below 20 nanometers, or below 10 nanometers, or below 5 nanometers, or below 2 nanometers, or below 1 nanometer, of even below 0.5 nanometers. The continuity referred to herein can be physical continuity or electrical continuity. In some embodiments of the disclosure the thickness at which the hafnium lanthanum oxide film may be physically continuous may not be the same as the thickness at which a film is electrically continuous, and vice versa.

In some embodiments of the disclosure, the hafnium lanthanum oxide film may be deposited on a substrate comprising high aspect ratio features, e.g., a three-dimensional, non-planar substrate. In some embodiments, the hafnium lanthanum oxide film may be deposited over a substrate which comprises one or more trench structures and/or fin structures with an aspect ratio (height/width) of greater than 10:1, or greater than 20:1, or greater than 30:1, or even greater than 50:1. In such embodiments wherein the hafnium lanthanum oxide film is deposited over a substrate comprising high aspect ratio features the step coverage of the deposited film may be greater than approximately 90%, or greater than approximately 95%, or greater than approximately 99%, or even substantially equal to 100%.

In some embodiments of the disclosure, the hafnium lanthanum oxide films deposited according to the embodiments of the disclosure may be subjected to one or more post deposition processes to further improve the quality of the films, e.g., to improve crystallinity, or densify the film. Therefore, in some embodiments, the methods of the disclosure may further comprise thermally annealing the hafnium lanthanum oxide film post deposition. For example, the hafnium lanthanum oxide film may be thermally annealed at a temperature of less than 800° C., or less than 700° C., or less than 600° C., or less than 500° C., or less than 400° C., or even less than 300° C., or at a temperature range between 300° C. and 800° C., or between 350° C. and 750° C., or between 400° C. and 600° C.

In some embodiments of the disclosure, the post deposition thermal annealing of the hafnium lanthanum oxide film may be performed within a reaction chamber under a controlled environment. For example, the thermal annealing of the hafnium lanthanum oxide film may be performed in an inert gas atmosphere, such as, for example, noble gases (e.g., Ar, He, etc.) or nitrogen. In additional examples, the thermal annealing of the hafnium lanthanum oxide film may be performed in a hydrogen containing ambient, such as, forming gas ($H_2/N_2$), for example. In further examples, the thermal annealing of the hafnium lanthanum oxide film may be performed in an oxygen containing ambient, such as, for example, molecular oxygen ($O_2$), water ($H_2O$), ozone ($O_3$), or hydrogen peroxide ($H_2O_2$).

In some embodiments of the disclosure, thermally annealing the hafnium lanthanum oxide film post deposition further comprises at least partially crystallizing the hafnium lanthanum oxide film. In some embodiments, thermally annealing the hafnium lanthanum oxide film post deposition may form a hafnium lanthanum oxide film which comprises a predominantly orthorhombic crystal structure. In some embodiments, thermally annealing the hafnium lanthanum oxide film post deposition further comprises forming a substantially single crystalline hafnium lanthanum oxide film. In some embodiments, the substantially single crystalline hafnium lanthanum oxide film comprises a predominantly orthorhombic crystal structure. In some embodiments of the disclosure, the hafnium lanthanum oxide film may be deposited in an amorphous state and thermally annealing the hafnium lanthanum oxide film may provide a controlled crystallization of the $LaHfO_x$ film.

FIG. 5 illustrates exemplary data showing the crystallization temperature for a number of exemplary hafnium lanthanum oxide films deposited according to the embodiments of the disclosure at various deposition temperatures and with increasing lanthanum composition (atomic-%). Examination of FIG. 5 reveals that the crystallization temperature of the exemplary hafnium lanthanum oxide films decreases with decreasing lanthanum composition (atomic-%) in the exemplary hafnium lanthanum oxide films. As a non-limiting example, the hafnium lanthanum oxide film may comprise a composition of lanthanum of equal to or less than 1 atomic-% with a crystallization temperature of less than 600° C. As a further non-limiting example, the hafnium lanthanum oxide film may comprise a composition of lanthanum of equal to or less than 1 atomic-% with a crystallization temperature of less than approximately 450° C.

Further examination of FIG. 5 reveals that in general the crystallization temperature of the exemplary hafnium lanthanum oxide films decreases with increasing deposition temperature of the hafnium lanthanum oxide films. As a non-limiting example, a hafnium lanthanum oxide film may comprise a composition of lanthanum of equal to or less than 1 atomic-% deposited at a deposition temperature of less than 200° C. and a corresponding crystallization temperature of less than 650° C., or less than 600° C., or less than 550° C., or between a temperature of 550° C. and 650° C. As a further non-limiting example, a hafnium lanthanum oxide film may comprise a concentration of lanthanum of equal to or less than 1 atomic-% deposited at a deposition temperature of less than 300° C. and a corresponding crystallization temperature of less than 550° C., or less than 500° C., or less than 450° C., or between a temperature of 450° C. and 550° C.

FIG. 6 illustrates exemplary data showing the crystallization temperature for a number of exemplary hafnium lanthanum oxide films with increasing lanthanum composition (atomic-%) at various film thicknesses. Examination of FIG. 6 reveals that in general the crystallization temperature decreases with decreasing lanthanum content in the hafnium lanthanum oxide film, as demonstrated previously. Further examination of FIG. 6 reveals that crystallization temperature also decreases with increasing thickness of the hafnium lanthanum oxide films. For example, in some embodiments, the hafnium lanthanum oxide film may have a lanthanum composition between approximately 1.5 atomic-% and 3 atomic-% with a corresponding crystallization temperature between approximately 540° C. and 680° C. In some embodiments, the hafnium lanthanum oxide film may have a lanthanum composition of less than 1.5 atomic-%, a film thickness of less than 3 nanometers, and a crystallization temperature of less than 650° C. In some embodiments, the hafnium lanthanum oxide film may have a lanthanum composition of less than 1.5 atomic-%, a film thickness of less than 5 nanometers, and a crystallization temperature of less than 600° C. In some embodiments, the hafnium lanthanum oxide film may have a lanthanum composition of less than 1.5 atomic-%, a film thickness of less than 7 nanometers, and a crystallization temperature of less than 560° C. In some embodiments, the hafnium lanthanum oxide film may have a lanthanum composition of less than 1.5 atomic-%, a film thickness of less than 10 nanometers, and a crystallization temperature of less than 550° C.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

What is claimed is:

1. A method for depositing a hafnium lanthanum oxide film on a substrate by a cyclical deposition process in a reaction chamber, the method comprising:
    depositing a hafnium oxide film on the substrate utilizing at least one deposition cycle of a first sub-cycle of the cyclical deposition process, wherein the at least one deposition cycle of the first sub-cycle comprises:
        contacting the substrate with a hafnium vapor phase precursor; and
        contacting the substrate with a first oxidizer precursor comprising water ($H_2O$);
    depositing a lanthanum oxide film on the substrate utilizing at least one deposition cycle of a second sub-cycle of the cyclical deposition process, wherein the at least one deposition cycle of the second sub-cycle comprises:
        contacting the substrate with a lanthanum vapor phase precursor; and
        contacting the substrate with a second oxidizer precursor comprising molecular oxygen ($O_2$);
    wherein the cyclical deposition process comprises varying a ratio of a number of performed first sub-cycles to a number of performed second sub-cycles, and wherein the ratio of second sub-cycles performed to first sub-cycles performed per super-cycle is less than 0.2.

2. The method of claim 1, wherein the hafnium vapor phase precursor comprises at least one of a hafnium halide precursor or a hafnium metalorganic precursor.

3. The method of claim 2, wherein the hafnium halide precursor comprises at least one of hafnium tetrachloride ($HfCl_4$), hafnium tetraiodide ($HfI_4$), or hafnium tetrabromide ($HfBr_4$).

4. The method of claim 2, wherein the hafnium metalorganic precursor comprises at least one of tetrakis(ethylmethylamido)hafnium ($Hf(NEtMe)_4$), tetrakis(dimethylamido)hafnium ($Hf(NMe_2)_4$), tetrakis(diethylamido)hafnium ($Hf(NEt_2)_4$), tris(dimethylamido)cyclopentadienylhafnium ($HfCp(NMe_2)_3$), or bis(methylcyclopentadienyl)methoxymethyl hafnium (($MeCp)_2 Hf(CH_3)(OCH_3)$).

5. The method of claim 1, wherein the lanthanum vapor phase precursor comprises at least one of a lanthanum amidinate or a lanthanum cyclopentadienyl compound.

6. The method of claim 1, wherein, prior to the depositing of the hafnium oxide film on the substrate, heating the substrate to a temperature of from 100° C. to 400° C.

7. The method of claim 1, wherein the lanthanum composition uniformity in the hafnium lanthanum oxide film is less than 2 atomic-% (1-sigma).

8. The method of claim 1, wherein the hafnium lanthanum oxide film has a lanthanum composition of less than 10 atomic-%.

9. The method of claim 1, wherein the hafnium lanthanum oxide film has a thickness of less than 20 nanometers.

10. The method of claim 9, wherein the hafnium lanthanum oxide film has a thickness between 3 nanometers and 10 nanometers.

11. The method of claim 1, wherein the second oxidizer precursor comprises molecular oxygen ($O_2$) with a purity greater than 99.999%.

12. The method of claim 1, wherein the first oxidizer precursor comprises water with an electrical resistivity of greater than 5 MΩ-cm.

13. The method of claim 1, wherein the hafnium oxide film is deposited to a thickness of less than 3 nanometers, and wherein the lanthanum oxide film is deposited to a thickness of less than 3 nanometers.

14. The method of claim 1, wherein the hafnium lanthanum oxide film comprises a tertiary hafnium lanthanum oxide film.

15. The method of claim 1, further comprising thermally annealing the hafnium lanthanum oxide film following depositing of the hafnium lanthanum oxide film at a temperature of less than 800° C.

16. The method of claim 15, wherein thermally annealing the hafnium lanthanum oxide film further comprises at least partially crystallizing the hafnium lanthanum oxide film.

17. The method of claim 16, wherein the hafnium lanthanum oxide film comprises a composition of lanthanum of equal to or less than 1 atomic-% with a crystallization temperature of less than approximately 600° C.

18. The method of claim 16, wherein the at least partially crystallized hafnium lanthanum oxide film comprises a predominantly orthorhombic crystal structure.

19. The method of claim 1, wherein the cyclical deposition process comprises one or more repeated super-cycles, each super-cycle including depositing the hafnium oxide film on the substrate and depositing the lanthanum oxide film on the substrate.

20. A method for depositing a hafnium lanthanum oxide film on a substrate by a cyclical deposition process in a reaction chamber, the method comprising:
    depositing a hafnium oxide film on the substrate utilizing at least one deposition cycle of a first sub-cycle of the cyclical deposition process, wherein the at least one deposition cycle of the first sub-cycle comprises:
        contacting the substrate with a hafnium vapor phase precursor; and
        contacting the substrate with a first oxidizer precursor comprising water ($H_2O$);
    depositing a lanthanum oxide film on the substrate utilizing at least one deposition cycle of a second sub-cycle of the cyclical deposition process, wherein the at least one deposition cycle of the second sub-cycle comprises:
        contacting the substrate with a lanthanum vapor phase precursor; and
        contacting the substrate with a second oxidizer precursor comprising molecular oxygen ($O_2$);
    wherein the lanthanum composition uniformity in the hafnium lanthanum oxide film is less than 2 atomic-% (1-sigma).

* * * * *